(12) United States Patent
Ibrahim et al.

(10) Patent No.: US 11,272,045 B2
(45) Date of Patent: Mar. 8, 2022

(54) DISPLAY PRESENTATION ACROSS PLURAL DISPLAY SURFACES

(71) Applicant: Microsoft Technology Licensing, LLC, Redmond, WA (US)

(72) Inventors: Ziyad Ibrahim, Sammamish, WA (US); Glenn Frederick Evans, Kirkland, WA (US); Nicholas Fredrick Ray, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/181,214

(22) Filed: Nov. 5, 2018

(65) Prior Publication Data

US 2020/0142662 A1 May 7, 2020

(51) Int. Cl.
*H04M 1/02* (2006.01)
*G06F 3/14* (2006.01)
*G09G 5/14* (2006.01)

(52) U.S. Cl.
CPC ........ *H04M 1/0214* (2013.01); *G06F 3/1446* (2013.01); *G09G 5/14* (2013.01); *G09G 2300/026* (2013.01); *G09G 2354/00* (2013.01); *G09G 2380/02* (2013.01)

(58) Field of Classification Search
None
See application file for complete search history.

(56) References Cited

U.S. PATENT DOCUMENTS

| | | | |
|---|---|---|---|
| 2004/0051944 A1 | 3/2004 | Stark | |
| 2005/0083331 A1* | 4/2005 | MacKinlay | G06F 3/1446 345/473 |
| 2005/0117186 A1 | 6/2005 | Li et al. | |
| 2006/0077544 A1 | 4/2006 | Stark | |
| 2010/0259566 A1 | 10/2010 | Watanabe | |
| 2011/0249042 A1* | 10/2011 | Yamamoto | G09G 3/342 345/690 |
| 2012/0206896 A1 | 8/2012 | Suzuki et al. | |
| 2012/0249622 A1 | 10/2012 | Yoshida et al. | |

(Continued)

OTHER PUBLICATIONS

"International Search Report and Written Opinion Issued in PCT Application No. PCT/US19/058421", dated Aug. 19, 2020, 18 Pages.

(Continued)

*Primary Examiner* — Christopher R Lamb
(74) *Attorney, Agent, or Firm* — Alleman Hall Creasman & Tuttle LLP

(57) ABSTRACT

An electronic display system comprises first and second display surfaces and a computer. Each of the first and second display surfaces is configured to receive and transmit display light from an emissive element. Each of the first and second display surfaces includes both a flat portion and an edge portion non-coplanar to the flat portion. The computer is configured to control the emissive elements of the first and second display surfaces so as to present a first section of a display image on the first display surface and a second section of the display image on the second display surface. In this example, one or more rows of the display image rendered on the flat portion of a display surface are rendered duplicatively on an edge portion.

19 Claims, 7 Drawing Sheets

(56) References Cited

U.S. PATENT DOCUMENTS

| | | | |
|---|---|---|---|
| 2013/0181892 A1* | 7/2013 | Liimatainen | G06F 3/011 |
| | | | 345/156 |
| 2014/0240828 A1 | 8/2014 | Robinson et al. | |
| 2015/0160698 A1 | 6/2015 | Tsukamoto et al. | |
| 2015/0286457 A1* | 10/2015 | Kim | G06F 3/1446 |
| | | | 345/581 |
| 2016/0034047 A1* | 2/2016 | Lee | G06F 3/013 |
| | | | 345/156 |
| 2016/0054796 A1* | 2/2016 | Cho | G06K 9/0061 |
| | | | 345/156 |
| 2016/0088272 A1* | 3/2016 | Candry | G03B 21/567 |
| | | | 353/15 |
| 2018/0217429 A1† | 8/2018 | Busch | |
| 2019/0051230 A1* | 2/2019 | Jeon | G06F 1/1652 |

OTHER PUBLICATIONS

"Invitation to Pay Additional Fees Issued in PCT Application No. PCT/US19/058421", dated Feb. 17, 2020, 9 Pages.

\* cited by examiner
† cited by third party

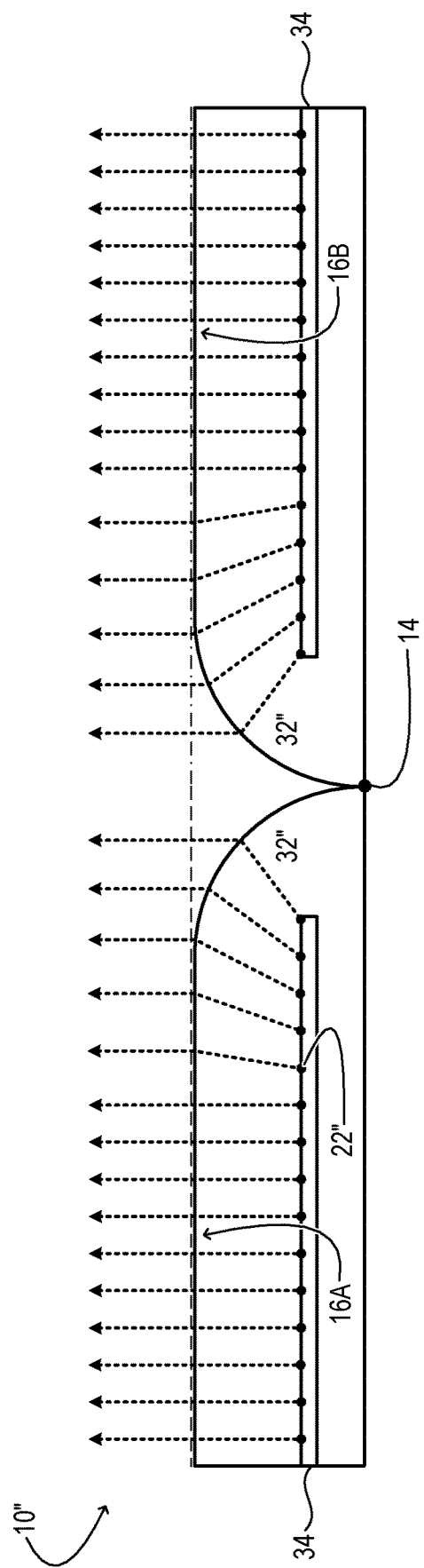

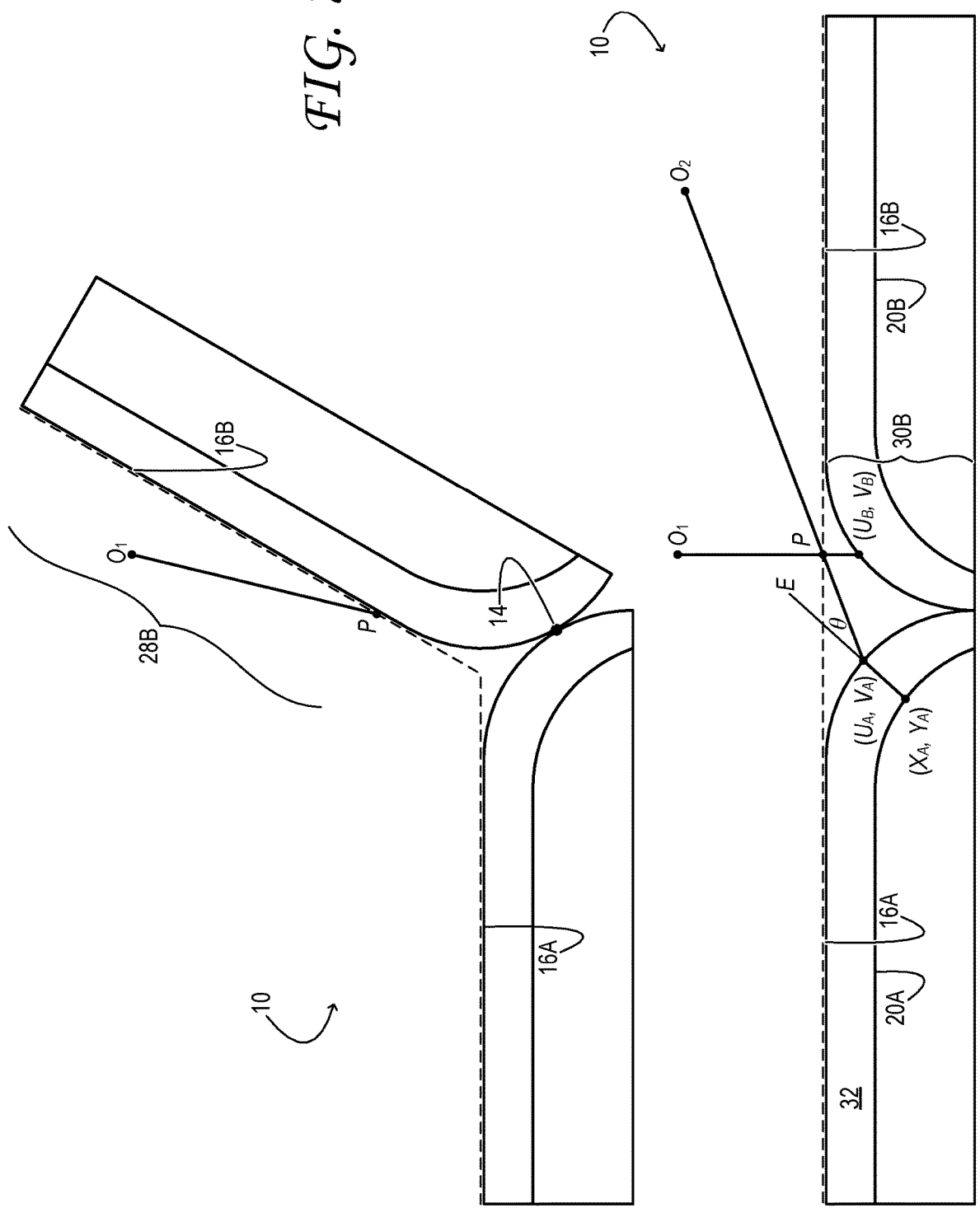

DISPLAY PRESENTATION ACROSS PLURAL DISPLAY SURFACES

BACKGROUND

Electronic display technology has undergone rapid growth in recent years. Electronic display systems have become larger, flatter, brighter, more power-efficient, and capable of true-to-life color at high resolution. On the other hand, display technology does not currently leverage the advantages of modular design.

SUMMARY

One aspect of this disclosure is directed to an electronic display system comprising first and second display surfaces and a computer. Each of the first and second display surfaces is configured to receive and transmit display light from an emissive element. Each of the first and second display surfaces includes both a flat portion and an edge portion non-coplanar to the flat portion. The computer is configured to control the emissive elements of the first and second display surfaces so as to present a first section of a display image on the first display surface and a second section of the display image on the second display surface. In this example, one or more horizontal or vertical rows of the display image rendered on the flat portion of a display surface are rendered duplicatively on an edge portion.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 4 shows aspects of an example electronic display system featuring hinged display surfaces arranged over liquid-crystal display (LCD) matrices.

FIGS. 7, 8A, and 8B shows aspects of an example implementation of the method of FIG. 6.

DETAILED DESCRIPTION

Figure 1:
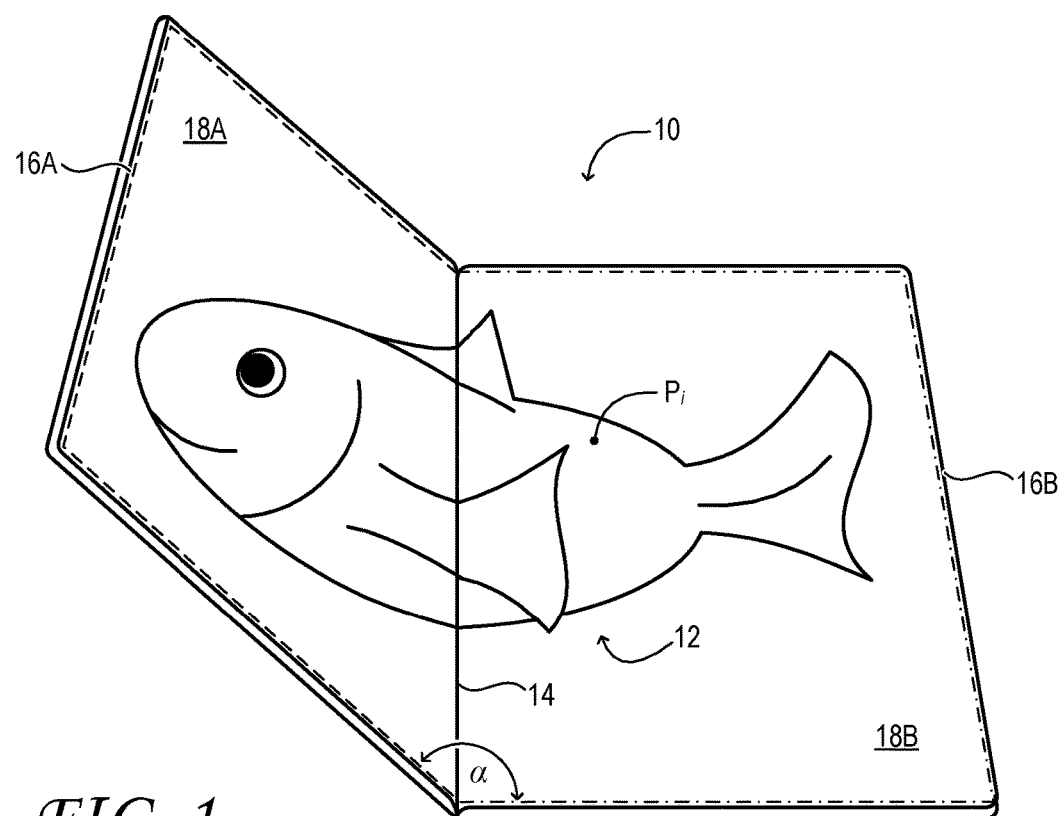
FIGS. 1 and 2 show aspects of example electronic display systems.

This disclosure is presented by way of example and with reference to the drawing figures listed above. Components, process steps, and other elements that may be substantially the same in one or more of the figures are identified coordinately and are described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

FIG. 1 shows aspects of an example electronic display system 10. The electronic display system as illustrated takes the form of a foldable tablet computer. In other examples, the electronic display system may take the form of a laptop computer or dual-screen smart phone. Electronic display systems of numerous other types, sizes, and form factors are equally envisaged. In FIG. 1, electronic display system 10 is shown presenting a display image 12. The nature of the display image is not particularly limited. In some examples, the display image may include a user interface of an application executing on the electronic display system. In some examples, the display image may include text. In some examples, the display image may be one of a sequence of video frames.

Generally speaking, display image 12 is comprised of a set of discrete loci $\{P_i\}$ arranged in three-dimensional (3D) space. In pixel-display implementations, each locus $P_i$ may correspond to a pixel of a display matrix used to form the display image. In color-display implementations, each locus $P_i$ may be associated with corresponding digital color values $R_i$, $G_i$, and $B_i$, which define the relative brightness of that locus in each of three different color channels. All of the loci of display image 12 may be coplanar in some examples, but that condition is not strictly necessary. In FIG. 1, for instance, electronic display system 10 is a hinged device, and display image 12 is bent along the axis of hinge 14 to an angle $\alpha$.

Continuing in FIG. 1, electronic display system 10 includes a first display surface 16A and a second display surface 16B. Each display surface 16 (e.g., 16A and 16B in FIG. 1) is configured to receive and transmit display light from one or more light-emissive elements arranged beneath that display surface. In this manner, each display surface is configured to present at least a section of display image 12. In FIG. 1, the first and second display surfaces are separated by an adjustable angle $\alpha$, via hinge 14.

Figure 2:
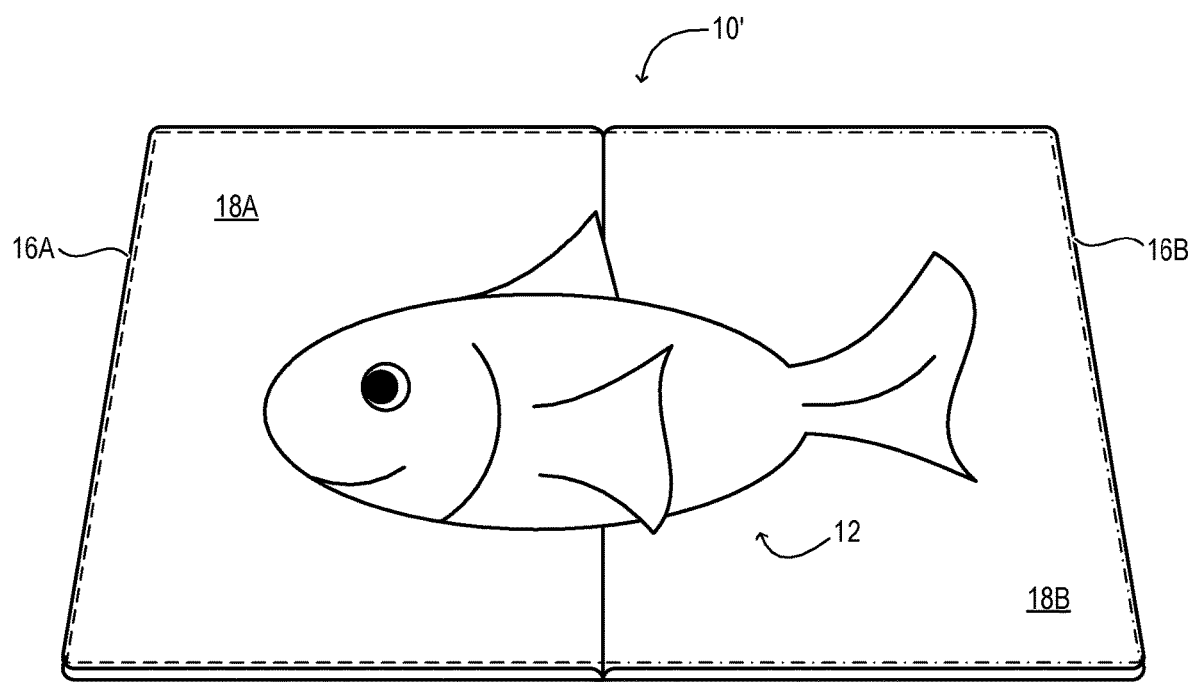

Implementations that differ from FIG. 1 are also envisaged. Some example electronic display systems may include only one display surface, or more than two. In electronic display systems having plural display surfaces, the plural display surfaces may be the same or different from each other with respect to dimensions and/or technology. In some examples, the plural display surfaces need not be joined by a hinge, but may simply abut each other in a tiled arrangement, and thereby present a unitary display image. FIG. 2 shows an example display system 10' configured in this manner.

In some examples, a single display surface 16 may be configured to present a display image 12 in its entirety. In other examples, as shown in FIGS. 1 and 2, a display image may be partitioned into a plurality of sections 18 (e.g., sections 18A and 18B), and each display surface 16 may be configured to present a different, corresponding section. In those examples in which a display image is presented in sections, seamless, gapless presentation across the sections may be desired. This aspect is now developed with reference to FIG. 3A, which shows an example display surface 16 and associated display componentry of electronic display system 10. In particular, FIG. 3A shows an organic light-emitting diode (OLED) matrix 20, in which a plurality of individually addressable, emissive OLED elements 22 are arranged beneath the display surface.

Figure 3A:
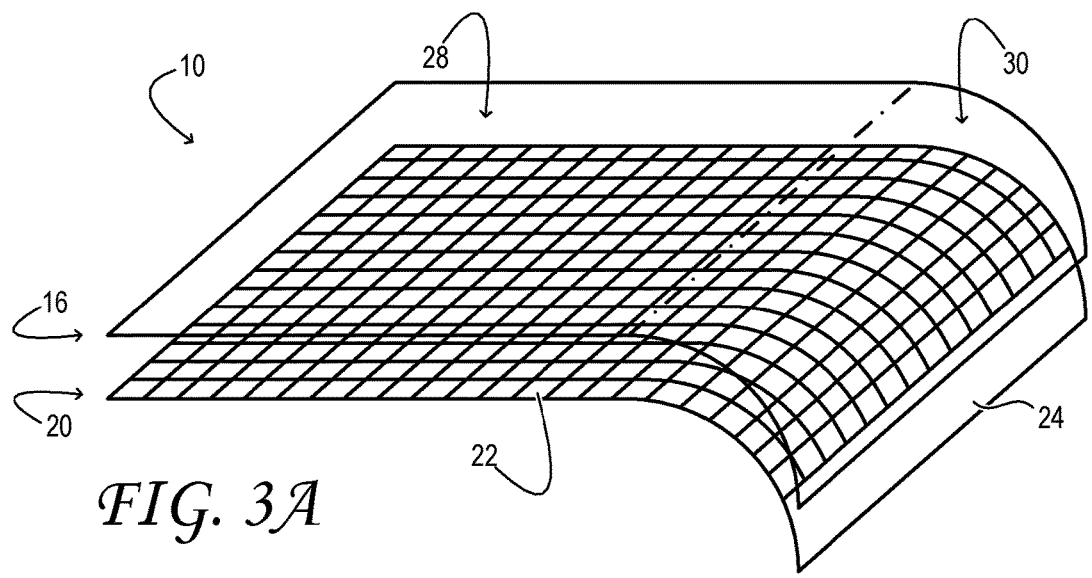
FIGS. 3A, 3B, and 3C show aspects of an example electronic display system featuring hinged display surfaces arranged over curved organic light-emitting diode (OLED) matrices.
Figure 3B:
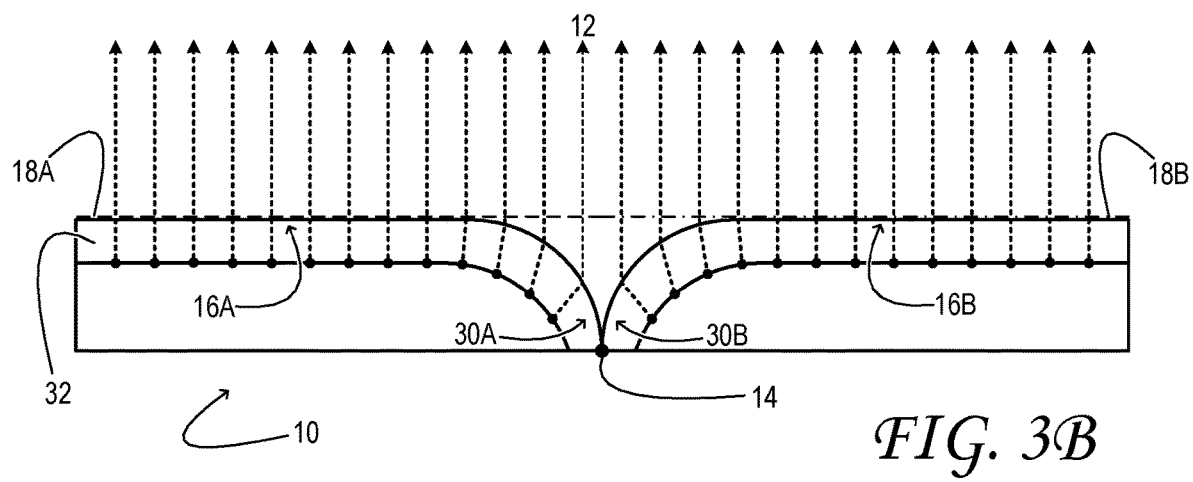

In the example of FIG. 3A, the elements 22 of OLED matrix 20 are bordered by a nonemissive area 24, which may be configured to seal or secure the OLED matrix, or provide electrical connections for addressing the elements. To conceal the display-image gap that would otherwise be observed at this edge, the nonemissive area of the OLED matrix may be bent or curved away from the primary viewing plane, which is defined by flat portion 28A of display surface 16. The display surface is similarly bent or curved to follow substantially the contour of the OLED matrix. Accordingly, display surface 16 includes, in addition to flat portion 28, an edge portion 30, which is non-coplanar (i.e., nonparallel in an areal sense) to the flat portion. In the illustrated example, the edge portion follows the smooth curve of the OLED matrix. More generally, the edge portion may comprise any number of curved and/or plane-bevel facets non-coplanar to the flat portion. As shown in FIG. 3B, two hinged or otherwise abutting display surfaces 16, configured in this manner, may be used to present a continuous, essentially unbroken display image 12, where a different section 18 of the display image (e.g., 18A and 18B in FIG. 3B) is presented on each display surface. In the example of FIG. 3B, hinge 14 is situated between adjacent edge portions 30 and is configured to pivotally couple display surface 16A to display surface 16B.

In the illustrated example, each display surface 16 is the outer surface of a glass or transparent-polymer cover layer 32 of substantially constant thickness. In other examples, the thickness and/or structure of the cover layer may be varied in order to impart desired ray-guiding properties. In particular, the cover layer may be configured so as to collect the emission from the OLED elements 22 below edge portion 30 and to release the emission in a direction normal to the primary viewing plane. Used in conjunction with curved OLED matrix 20, this approach may be used to provide substantially distortion-free image display all the way to visible edge of each display surface 16.

Despite the applicability of curved OLED matrix 20 to borderless image display, alternative display technologies are also consonant with this disclosure. FIG. 4. shows aspects of an electronic display system 10" based on liquid-crystal display (LCD) matrices 34. In this example, a suitably engineered cover layer 32" may be used to re-image the pixel elements 22" of the LCD display so that the pixel elements appear very close to the shared edge of each display surface 16. In some cases, image distortion resulting from the re-imaging may be corrected preemptively during rendering of the display-image (vide infra).

Turning back to FIG. 3C, electronic display system 10 includes a computer 36. Operatively coupled to the display componentry of the electronic display system, the computer may execute the rendering of display image 12 in addition to any other process described herein. To that end, the computer may include at least one processor 38 and associated computer memory 40. In the illustrated example, the computer may be configured to individually address and control the emission from each OLED element 22. In electronic display systems having plural display surfaces 16, the same computer 36 may address and control plural associated display matrices. This tactic enables plural sections 18 of the display image to be rendered concertedly. Accordingly, the computer may be configured to render a plurality of sections of a display image for presentation on a corresponding plurality of display surfaces of the electronic display system.

In some examples, display-image rendering is responsive to one or more geometric inputs to computer 36 of electronic display system 10. The geometric inputs may reflect (1) the configuration of the electronic display system, including the layout and conformation among the various display surfaces; (2) the orientation of the electronic display system as configured; and (3) one or more ocular positions O of the user in a frame of reference of the electronic display system. In some examples, each geometric input may be furnished by a sensor arranged in the electronic display system and coupled operatively to the computer. Alternatively, or in addition, each geometric input may be estimated heuristically by the computer based on the current usage scenario of the electronic display system. Moreover, each geometric input may be evaluated and re-evaluated in real time as the electronic display system is used, so that the computer is able to dynamically adjust the display-image presentation in response to changing geometry. Example geometric inputs are described below.

Figure 3C:
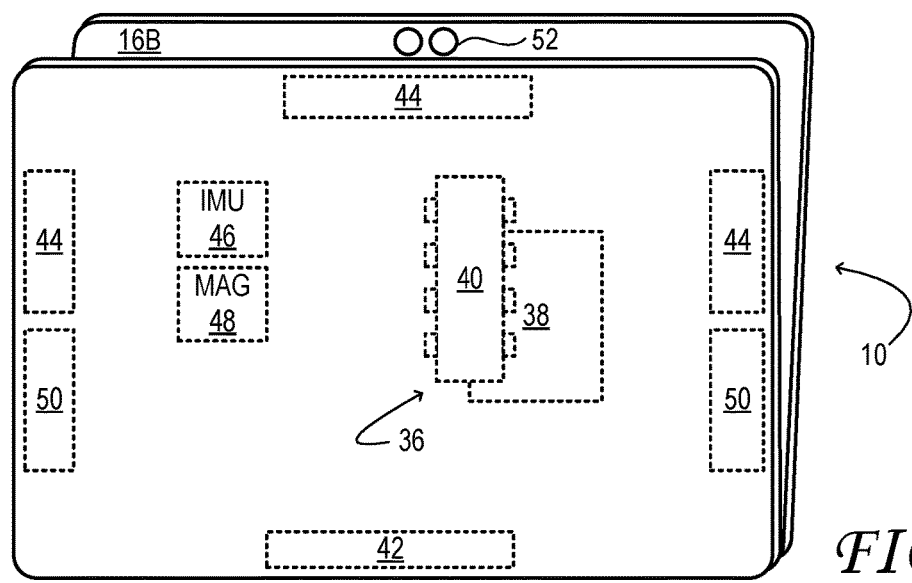

Continuing in FIG. 3C, electronic display system 10 includes a hinge-angle sensor 42 and at least one abutment sensor 44. The hinge-angle sensor is configured to furnish an output responsive to the angle of separation $\alpha$ between flat portion 28A and flat portion 28B of respective display surfaces 16A and 16B. Each abutment sensor 44 is configured to furnish an output responsive to abutment of display surface 16A to any other display surface 16. In some examples, the hinge-angle sensor may be potentiometer-based, and the abutment sensor may be an electrostatic or Hall-effect sensor; in other examples, various other sensor technologies may be used.

Electronic display system 10 includes an inertial measurement unit (IMU) 46, magnetometer 48, and palm sensor 50. The IMU may comprise either or both of a multi-axis accelerometer and a multi-axis gyroscope configured to sense, respectively, translational and rotational movement of the electronic display system. The magnetometer may be configured to sense the absolute orientation of the electronic display system based on a geomagnetic measurement. Alone or in combination with the output from hinge-angle sensor 42, output from the IMU and magnetometer are responsive to the orientation of each display surface 16 of the electronic display system. Accordingly, such output may be furnished to computer 36. When included, palm sensor 50 may be configured to sense the location of the user's palm in scenarios in which the electronic display system is being held in the user's hand. In configurations in which the IMU and magnetometer are omitted, the computer may be configured to estimate the orientation of each display surface heuristically, based on output from the palm sensor. In still other examples, feature imaging based on a world-facing camera may be used to determine the orientation of the electronic display system.

Figure 5:
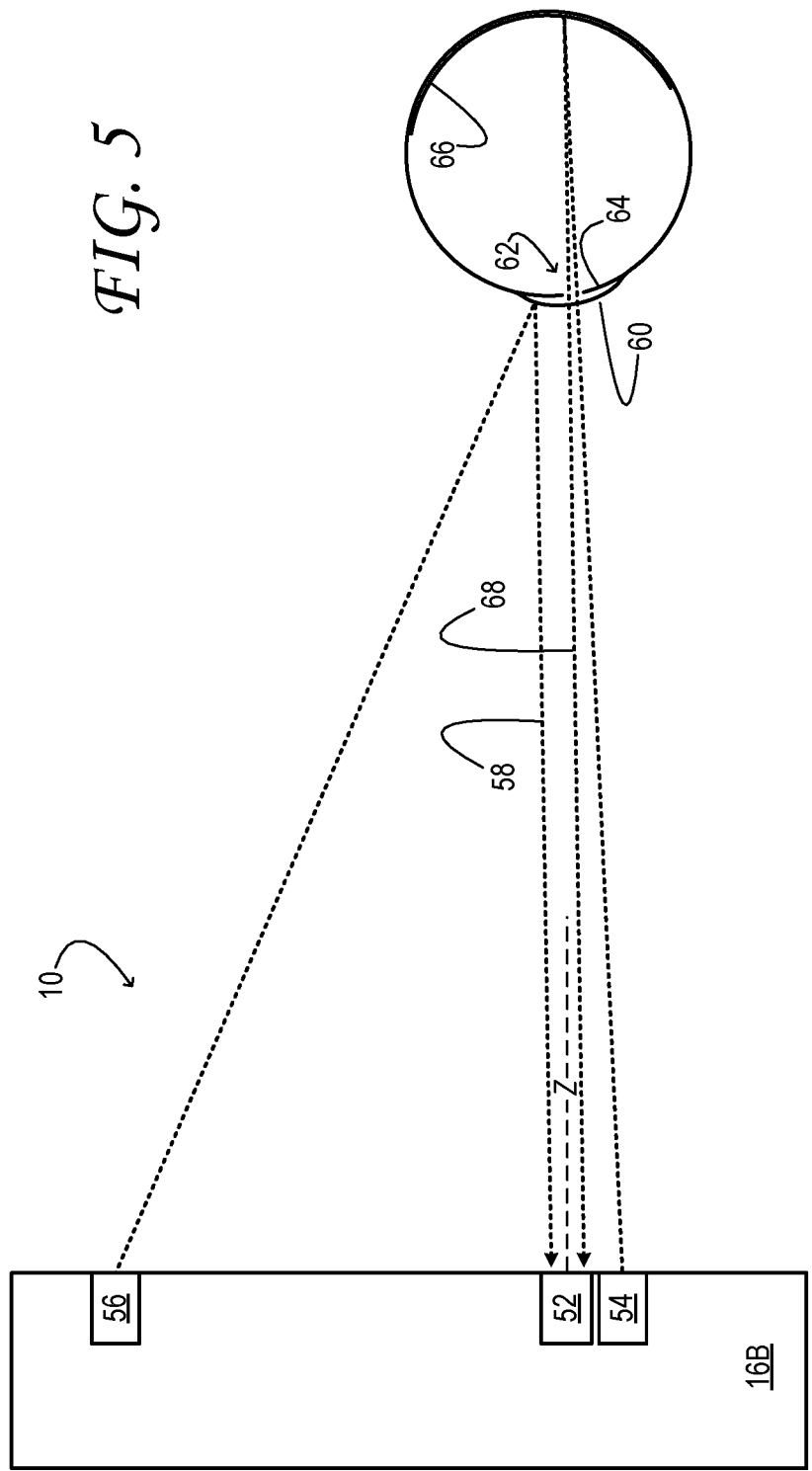
FIG. 5 shows aspects of estimation of a user's ocular position in an example electronic display system.

Electronic display system 10 includes an optional user-facing camera 52 configured to acquire an ocular image of the user. More particularly, the user-facing camera is configured to image the user's pupils, eyes, face, or head in real time. As shown in FIG. 5, user-facing camera 52 includes an on-axis lamp 54 and an off-axis lamp 56, these terms referring to the direction of illumination with respect to the optical axis Z of the user-facing camera. Each lamp may comprise a light-emitting diode (LED) or diode laser, for example, which emits infrared (IR) or near-IR illumination in a high-sensitivity band of the user-facing camera. Off-axis illumination may create a specular glint 58 that reflects from the cornea 60 of the user's eye. Off-axis illumination may also be used to illuminate the eye for a 'dark pupil' effect, where pupil 62 appears darker than the surrounding iris 64. By contrast, on-axis illumination may be used to create a 'bright pupil' effect, where the pupil appears brighter than the surrounding iris. More specifically, illumination of the retroreflective tissue of retina 66 may reflect back through the pupil, forming a bright image 68.

Ocular image data from user-facing camera 52 may be conveyed to computer 36. There, the data may be processed to resolve such features as the pupil center, pupil outline, and/or one or more specular glints 58. The locations of such features in the image data may be used as input parameters in a model—e.g., a polynomial model—that relates feature position to an estimate of the right or left ocular position O of the user. In some implementations, the ocular position O may correspond to a pupil position itself. In other implementations, the ocular position may correspond to a position of the dominant eye of the user, or to a position that bisects a line segment joining the right and left eyes, for instance. In still other implementations, the user-facing camera may be configured to recognize the user's face, or head, and ocular positions may be estimated based on a suitable anatomical model. In examples in which two or more users are detected in the ocular image, additional ocular positions may be computed.

Despite the benefit of sensory estimation of ocular positions O, user-facing camera 52 may be omitted in some implementations. Instead, computer 36 may be configured to estimate the ocular positions based on a series of heuristics. For example, the user may be expected to view electronic display system 10 from a side opposite to the side that the operating system recognizes as the 'top'. In addition, the palm location may be sensed by palm sensor 50 and used to predict the likely vantage point of the user. For example, the user may be expected to view the display screen from the side which is opposite to the side where the palm is located.

Figure 6:
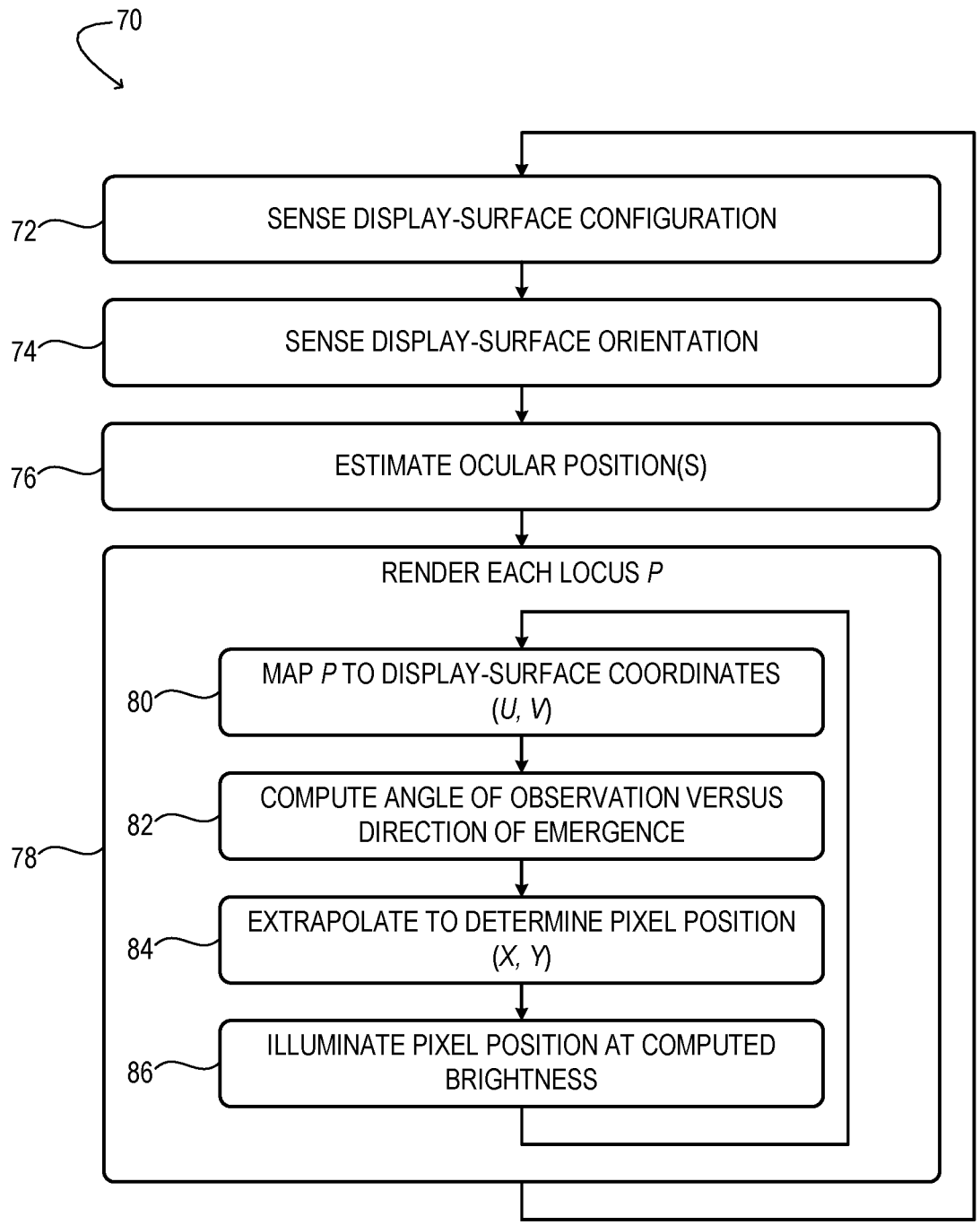
FIG. 6 illustrates an example method to present a display image on an electronic display system.

FIG. 6 illustrates aspects of an example method 70 to present on an electronic display system 10 a display image 12 viewable from an ocular position O. The display image may be presented on one or more display surfaces 16 of the electronic display system.

At 72 of method 70, the configuration among two or more display surfaces 16 of electronic display system 10 is sensed by computer 36. In examples involving tiled display surfaces, the configuration may include layout information defining the relative arrangement of the display surfaces. In some examples (e.g., those involving hinged display surfaces), the configuration may include conformational information defining the relative orientation of the display surfaces as determined by the hinge angle α. In some examples, accordingly, the configuration may be sensed via output from hinge-angle sensor 42 and/or abutment sensors 44, in view of stored data reflecting the dimensions and static configuration of the various display surfaces. It will be noted that the hinge angle α, in some implementations, affects not only the orientation of a hinged display surface, but also the viewable size of that surface as viewed from a given ocular position (vide infra).

Continuing in FIG. 6, at 74 the overall orientation of the one or more display surfaces 16 of electronic display system 10 is sensed. The orientation may be sensed by computer 36 based on the output of IMU 46, magnetometer 48, and/or palm sensor 50, for example.

At 76 one or more ocular positions O of one or more users of electronic display system 10 are estimated in the frame of reference of the display image 12. In electronic display systems equipped with a user-facing camera 52, as described above, the ocular positions may be estimated by acquisition of an ocular image of the one or more users and subsequent analysis of the ocular image. In some examples, ocular positions may be estimated heuristically—e.g., based on palm positioning on the electronic display system.

At 78 there is a control loop, in which computer 36 iterates through each locus P of display image 12 and renders that locus at appropriate coordinates (U, V) of any display surface 16 on which the locus would be visible from ocular position O. In some implementations, the control loop at 78 may be executed for each display surface 16 of electronic display system 10, in sequence or in parallel.

At 80, and now referring also to FIG. 7, a locus P is mapped to coordinates (U, V) of display surface 16 where a straight line OP passing through O and P intersects the display surface. If the point of intersection of OP is within the boundaries of the display surface, then locus P will be presented on that display surface. Otherwise, P will not be presented on that display surface, but may be presented on another display surface. In this manner, method 70 effectively partitions display image 12 into one or more sections 18 based on the position of that locus in the display image, and further based on the geometric inputs specifying configuration, orientation, and ocular position.

At 82 the angle θ of the straight line OP is computed relative to the direction E of emergence of light from display surface 16. In some examples—e.g., when display surface 16 is locally parallel to underlying OLED matrix 20—the direction of emergence may be normal to the display surface at coordinates (U, V). More generally, the direction of emergence may be computed based on the orientation of the emissive element 22 and the ray-directing properties (e.g., refractive index and thickness) of cover layer 32. Typically, each OLED element 22 emits a Lambertian distribution centered normal (i.e., orthogonal) to the matrix. Accordingly, the energy emitted at non-orthogonal angles (θ>0) may be computed in terms of the cosine of θ. In some examples, the projected off-orthogonal energy may be increased by the inverse of this value in order to compensate the observed brightness for the angle of observation. The angle may also be useful, inter alia, for mapping display surface coordinates (U, V) to a corresponding pixel position (X, Y).

At 84, accordingly, the straight line OP is extrapolated in order to determine which pixel position (X, Y) of display matrix 20 correspond to mapped coordinates (U, V) of display surface 16. In some examples, the extrapolation may be computed according to Snell's Law applied at the display surface, in view of the refractive index of cover layer 32. Such extrapolation is appropriate in examples in which light from an emissive element 22 refracts through cover layer 32 en route to coordinates (U, V).

At 86 the corresponding pixel position (X, Y) is illuminated to a brightness which is based on the angle θ computed relative to the direction of emergence of light from display surface 16. Illumination of the pixel position may include actively increasing the level of illumination for coordinates (U, V) with increasing angle θ, for a given desired brightness of locus P. In some examples, the active illumination at pixel position (X, Y) varies as 1/cos θ.

Steps 80 through 86 are now repeated, in sequence or in parallel, for all remaining loci P of display image 12. After all loci of the display image are rendered, method 70 may return to 72 for re-evaluation of the configuration, orientation, and ocular position, prior to presentation of the next display image. Accordingly, any change in the geometric inputs—the hinge angle or ocular position, for example—may be reflected in the subsequent presentation of the display image.

Figure 8A:
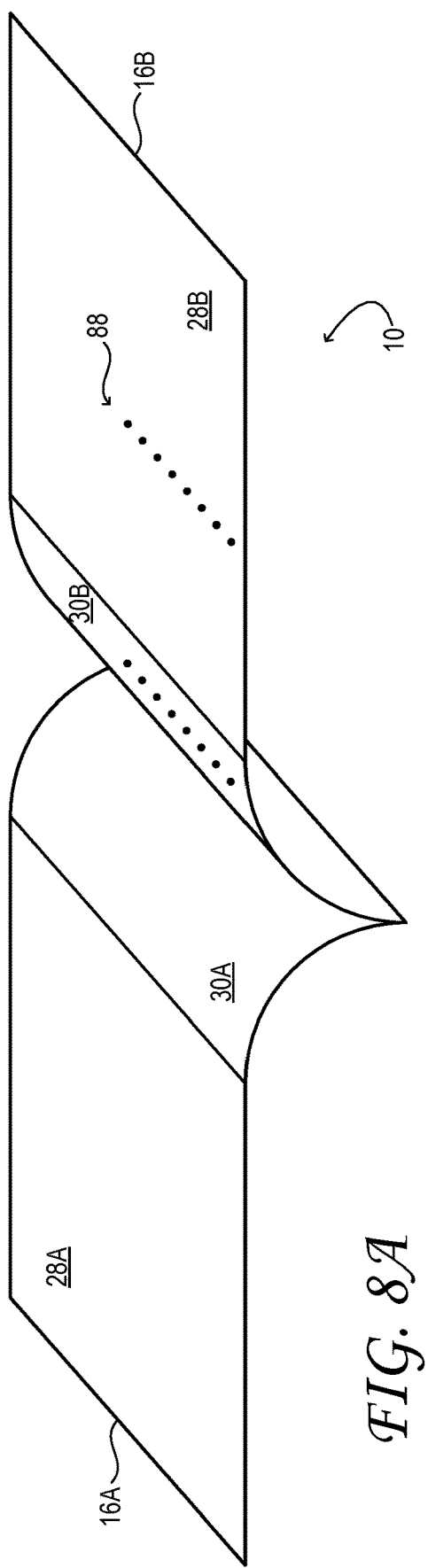

FIG. 7 demonstrates the implementation of method 70 under conditions of changing geometric inputs. In particular, FIG. 7 shows the rendering of the same locus P of display image 12 in different usage scenarios. When hinge 14 is set at an oblique angle and the display image is observed from ocular position $O_1$, P is rendered on flat portion 28B of display surface 16B. As the hinge angle is opened further, more of the edge portions of both display surfaces become visible, thereby extending further into the edge portions the area to which the display image is rendered. When the hinge is fully open, $O_1P$ is rotated relative to its initial position, and P is now rendered on edge portion 30B of display surface 16B, even though the ocular position $O_1$ has not changed. Accordingly, as the hinge angle increases, the display image, when viewed from $O_1$ of a user, flows continuously from flat portion 28B of display surface 16B to the edge portion 30B of the same display surface. To implement this effect, one or more rows of the display image rendered on flat portion 28B may be rendered duplicatively on (e.g., shifted over to) edge portion 30B. As used herein, the 'rows' of the display image may run horizontally or vertically with respect to the frame of reference of the electronic display system. Duplicative rendering of display content from flat portion 28B onto edge portion 30B is also shown in FIG. 8A. Here, the row of pixel positions 88 from the flat portion are duplicated on the edge portion of the same display surface.

Figure 8B:
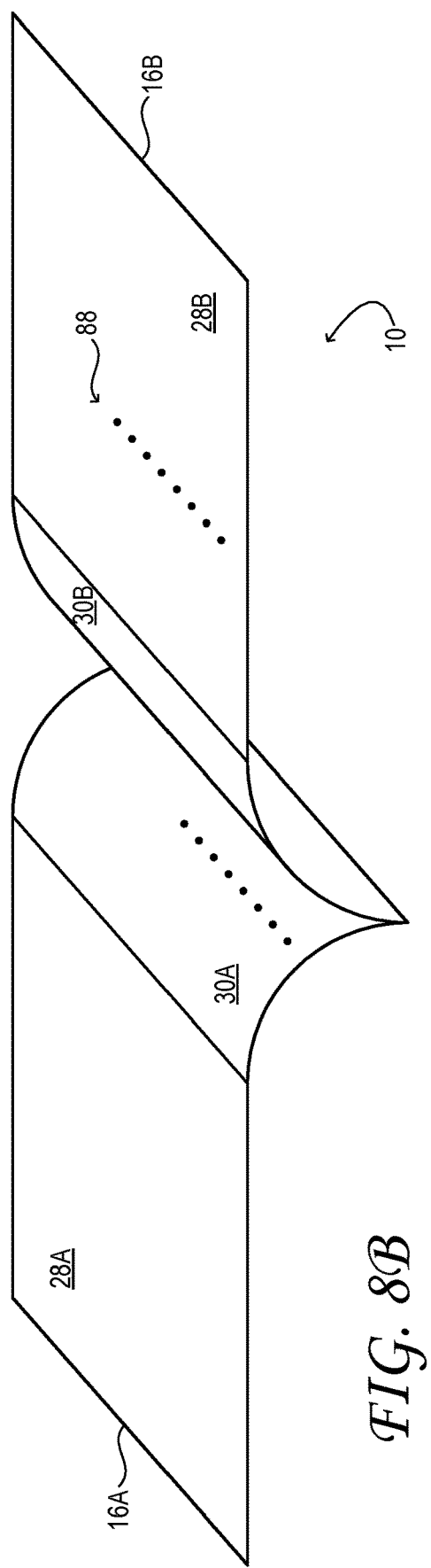

FIG. 7 also demonstrates the effect of method 70 for a case in which the user's ocular position shifts relative to electronic display system 10. As noted above, when hinge 14 is fully open P is rendered on edge portion 30B for observation from $O_1$. When the ocular position shifts to $O_2$, the display image flows continuously to edge portion 30A of adjacent display surface 16A. To implement this effect, one or more rows of the display image originally rendered on flat portion 28B may be rendered duplicatively on edge portion 30A. Duplicative rendering of display content from flat portion 28B onto edge portion 30A is also shown in FIG. 8B. Here, the row of pixel positions 88 from the flat portion are duplicated on the edge portion of the adjacent display surface. In some scenarios, duplication of pixel rows may be concurrent, such that the duplicated rows are displayed at the same time. In some scenarios (e.g., video scenarios), duplication of pixel rows may be from frame to frame, such that a portion of a frame is displayed using one row of pixels at an earlier time (e.g., $Frame_0$), and then a corresponding portion of a subsequent frame is displayed using another row of pixels at a later time (e.g., $Frame_1$).

One aspect of this disclosure is directed to an electronic display system comprising: a first display surface configured to receive and transmit display light from a first emissive element, the first display surface having a first flat portion and a first edge portion non-coplanar to the first flat portion; a second display surface configured to receive and transmit display light from a second emissive element, the second display surface having a second flat portion and a second edge portion non-coplanar to the second flat portion; and a computer configured to control the first and second emissive elements so as to present a first section of a display image on the first display surface and a second section of the display image on the second display surface, such that one or more rows of the display image rendered on the first flat portion are rendered duplicatively on the first or second edge portion.

In some implementations, the one or more rows of the display image rendered on the first flat portion are rendered duplicatively on the first edge portion. In some implementations, the one or more rows of the display image rendered on the first flat portion are rendered duplicatively on the second edge portion. In some implementations, the display image, when viewed from a first ocular position of a user, flows continuously from the first flat portion to the first or second edge portion. In some implementations, the first and second sections are rendered so that the display image, when viewed from a second ocular position of the user, flows continuously from the second flat portion to the first or second edge portion. In some implementations, the computer is further configured to partition the display image into the first and second sections based on an estimate of the first ocular position. In some implementations, the electronic display system further comprises a hinge situated between the first and second edge portions and configured to pivotally couple the first display surface to the second display surface, and a sensor furnishing an output responsive to an angle of separation between the first and second flat portions; here the computer is further configured to partition the display image into the first and second sections based on the output. In some implementations, the electronic display system further comprises a camera configured to acquire an ocular image of the user, and the computer is further configured to estimate the ocular position by analysis of the ocular image. In some implementations, the electronic display system further comprises a sensor furnishing an output responsive to one or more of an orientation of the first display surface and an abutment of the first display surface to another display surface, and the computer is further configured to partition the display image into the first and second sections based on the output.

Another aspect of this disclosure is directed to a method to present on a display surface of an electronic display system a display image viewable from an ocular position O, the method comprising: rendering a locus P of the display image by illuminating coordinates (U, V) of an edge portion of the display surface where a straight line OP passing through O and P intersects the edge portion, including increasing active illumination of the coordinates (U, V) with increasing angle of the straight line OP relative to a direction of emergence of light from the coordinates (U, V).

In some implementations, the direction of emergence is normal to a surface of the edge portion at the coordinates (U, V), and the active illumination is increased with increasing angle of OP relative to the normal of the display surface. In some implementations, increasing the active illumination includes increasing by a factor $1/\cos\theta$, where $\theta$ is the angle of OP relative to the direction of emergence of light from the coordinates (U, V). In some implementations, illuminating the coordinates (U, V) includes refracting light from an emissive element associated with the coordinates. In some implementations, the ocular position O is a position of a dominant eye of a user of the electronic display system, or a position that bisects a line segment joining right and left eyes of a user of the electronic display system. In some implementations, the method further comprises estimating the ocular position O heuristically. In some implementations, the method further comprises acquiring an ocular image of a user of the electronic display system, and the ocular position O is estimated by analysis of the ocular image. In some implementations, the ocular position O is a pupil position.

Another aspect of this disclosure is directed to a method to present on first and second display surfaces of an electronic display system a display image viewable from an ocular position O, the method comprising: sensing a configuration of the first and second display surfaces; estimating the ocular position O; rendering a locus P of the display image by illuminating coordinates (U, V) of the first display surface where a straight line OP passing through O and P intersects the first display surface; and re-rendering the locus P of the display image by illuminating different coordinates (U', V') of the first or second display surface where a straight line OP passing through O and P intersects the first or second display surface, responsive to a change in OP.

In some implementations, the change in OP is responsive to a change in O. In some implementations, the first and second display surfaces are held apart by an adjustable angle via a hinge situated between the first and second display surfaces, and the change in OP is responsive to a change in the angle.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic display system comprising:
a first display surface configured to receive and transmit display light from a first emissive element, the first display surface having a first flat non-edge portion and a first curved edge portion non-coplanar to the first flat non-edge portion;
a second display surface configured to receive and transmit display light from a second emissive element, the second display surface having a second flat non-edge portion and a second curved edge portion non-coplanar to the second flat non-edge portion; and
a computer configured to control the first and second emissive elements to:
present a first section of a display image on the first display surface and a second section of the display image on the second display surface,
responsive to a first condition, duplicate on the first curved edge portion one or more rows of the display image rendered on the first flat non-edge portion, and
responsive to a second condition, duplicate on the second curved edge portion one or more rows of the display image rendered on the first flat non-edge portion.

2. The electronic display system of claim 1 wherein the display image, when viewed from a first ocular position of a user, flows continuously from the first flat non-edge portion to the second curved edge portion.

3. The electronic display system of claim 2 wherein the first and second sections are rendered so that the display image, when viewed from a second ocular position of the user, flows continuously from the second flat non-edge portion to the second curved edge portion.

4. The electronic display system of claim 2 wherein the computer is further configured to partition the display image into the first and second sections based on an estimate of the first ocular position.

5. The electronic display system of claim 1 further comprising a hinge situated between the first and second curved edge portions and configured to pivotally couple the first display surface to the second display surface, and a sensor furnishing an output responsive to an angle of separation between the first and second flat non-edge portions, wherein the computer is further configured to partition the display image into the first and second sections based on the output.

6. The electronic display system of claim 1 further comprising a camera configured to acquire an ocular image of the user, wherein the computer is further configured to estimate the ocular position by analysis of the ocular image.

7. The electronic display system of claim 1 further comprising a sensor furnishing an output responsive to one or more of an orientation of the first display surface and an abutment of the first display surface to another display surface, and wherein the computer is further configured to partition the display image into the first and second sections based on the output.

8. The electronic display system of claim 1, wherein the computer is further configured such that the one or more rows of the display image rendered on the first flat non-edge portion are rendered concurrently on the second curved edge portion.

9. An electronic display system comprising:
a first display surface configured to receive and transmit display light from a first emissive element, the first display surface having a first flat non-edge portion and a first curved edge portion non-coplanar to the first flat non-edge portion;
a second display surface configured to receive and transmit display light from a second emissive element, the second display surface having a second flat non-edge portion and a second curved edge portion non-coplanar to the second flat non-edge portion; and
a computer configured to control the first and second emissive elements to:
heuristically estimate an ocular position O by sensing an orientation in which the electronic display system is being held,
partition a display image into first and second sections based on the ocular position O as heuristically estimated,
present the first section of the display image on the first display surface and the second section of the display image on the second display surface,
responsive to a first condition, duplicate on the first curved edge portion one or more rows of the display image rendered on the first flat non-edge portion, and
responsive to a second condition, duplicate on the second curved edge portion one or more rows of the display image rendered on the first flat non-edge portion.

10. The electronic display system of claim 9, wherein the computer is further configured, in rendering a locus P of the first section of the display image, to control the first and second emissive elements to increase active illumination of coordinates (U, V) of the first curved edge portion with increasing angle of a straight line OP relative to a direction of emergence of light from the coordinates (U, V), wherein the direction of emergence is normal to a surface of the first curved edge portion at the coordinates (U, V).

11. The electronic display system of claim 10, wherein the active illumination is increased by a factor $1/\cos\theta$, where $\theta$ is the angle of OP relative to the direction of emergence of light from the coordinates (U, V).

12. The electronic display system of claim 10, wherein rendering the locus P includes refracting light from an emissive element associated with the coordinates (U, V).

13. The electronic display system of claim 9, wherein the ocular position O is a position of a dominant eye of a user of the electronic display system, or a position that bisects a line segment joining right and left eyes of a user of the electronic display system.

14. The electronic display system of claim 9, wherein the computer is further configured to acquire an ocular image of a user of the electronic display system, wherein the ocular position O is estimated by analysis of the ocular image.

15. The electronic display system of claim 9, wherein the ocular position O is a pupil position.

16. An electronic display system comprising:
a first display surface configured to receive and transmit display light from a first emissive element, the first display surface having a first flat non-edge portion and a first curved edge portion non-coplanar to the first flat non-edge portion;
a second display surface configured to receive and transmit display light from a second emissive element, the second display surface having a second flat non-edge portion and a second curved edge portion non-coplanar to the second flat non-edge portion; and
a computer configured to control the first and second emissive elements to:
sense a configuration of the first and second display surfaces,
estimate an ocular position O,
present a first section of a display image with a locus P on the first display surface, wherein coordinates (U, V) of the first display surface are illuminated where a straight line OP passing through O and P intersects the first display surface,
present a second section of the display image on the second display surface,
responsive to a first condition, duplicate on the first curved edge portion one or more rows of the display image rendered on the first flat non-edge portion, and
responsive to a second condition, duplicate on the second curved edge portion one or more rows of the display image rendered on the first flat non-edge portion, wherein different coordinates (U', V') of the second display surface are illuminated where a straight line OP passing through O and P intersects the second display surface, responsive to a change in OP.

17. The electronic display system of claim 16, wherein the first and second display surfaces are held apart by an adjustable angle via a hinge situated between the first and second display surfaces, and wherein the change in OP is responsive to a change in the angle.

18. The electronic display system of claim 16, wherein sensing the configuration of the first and second display surfaces includes sensing layout information defining a relative arrangement of the first and second display surfaces.

19. The electronic display system of claim 16, wherein the computer is further configured to:
re-render the locus P pursuant to partitioning the display image into the first section displayed on the first display surface and the second section displayed on the second display surface; and
re-render the locus P pursuant to partitioning the display image into a third section displayed on the first display surface and a fourth section displayed on the second display surface, and wherein the first section differs from the third section.

* * * * *